(12) United States Patent
Hsieh et al.

(10) Patent No.: US 7,402,522 B2
(45) Date of Patent: Jul. 22, 2008

(54) HARD MASK STRUCTURE FOR DEEP TRENCHED SUPER-JUNCTION DEVICE

(75) Inventors: Hsing Huang Hsieh, Hsinchu (TW); Chien Ping Chang, Hsinchu (TW); Mao Song Tseng, Hsinchu (TW)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 11/372,106

(22) Filed: Mar. 10, 2006

(65) Prior Publication Data
US 2006/0276045 A1 Dec. 7, 2006

(30) Foreign Application Priority Data
Jun. 1, 2005 (TW) .............................. 94118076 A

(51) Int. Cl.
*H01L 21/302* (2006.01)
(52) U.S. Cl. ...................... 438/700; 438/706; 438/710; 438/720
(58) Field of Classification Search ................ 438/700, 438/706, 710, 720, 719, 296, 297
See application file for complete search history.

(56) References Cited

U.S. PATENT DOCUMENTS

| | | | | |
|---|---|---|---|---|
| 6,013,937 A | * | 1/2000 | Beintner et al. | ............. 257/513 |
| 6,709,917 B2 | * | 3/2004 | Panda et al. | ................. 438/243 |
| 2004/0207008 A1 | * | 10/2004 | Hadizad et al. | ............. 257/327 |

* cited by examiner

*Primary Examiner*—Lan Vinh
(74) *Attorney, Agent, or Firm*—Bacon & Thomas PLLC

(57) ABSTRACT

A hard mask structure is disclosed. The hard mask structure is used for manufacturing a deep trench of a super-junction device having a substrate and an epitaxial layer formed on the substrate. The hard mask structure comprises an ion barrier layer formed on the epitaxial layer for blocking ions from diffusing into the epitaxial layer, and a deposition layer formed on the ion barrier layer. Thereby, the deep trench of the super-junction device is formed by performing an etch process on the epitaxial layer via the hard mask structure. The hard mask structure can effectively prevent ions from diffusing into the epitaxial layer, so as to avoid unusual electrical property.

6 Claims, 11 Drawing Sheets

HARD MASK STRUCTURE FOR DEEP TRENCHED SUPER-JUNCTION DEVICE

FIELD OF THE INVENTION

The present invention relates to a hard mask structure for use in manufacturing a semiconductor device, and more particularly to a hard mask structure for use in manufacturing a deep trenched super-junction device.

BACKGROUND OF THE INVENTION

The Drain-Source ON Resistance (RDS(on)) of the conventional vertical metal oxide semiconductor field effect transistor (MOSFET) tends to become small and small. When the device is turned on, the RDS(on) is proportional to the power consumption of the device, so the power consumption of the MOSFET device can be reduced as the RDS(on) is reduced. The RDS(on) can be reduced by increasing the doping concentration. But sometimes the doping concentration cannot be increased as expected, since increasing the doping concentration may lower the breakdown voltage of the device. On the contrary, for the MOSFET device, the doping concentration cannot be reduced to increase the breakdown voltage without increasing unexpected RDS(on).

Therefore, a semiconductor device with both the increase of the breakdown voltage and the improvement of the RDS(on) is developed, which is named as a "super-junction device". The super-junction device includes a composite buffer layer, wherein the composite buffer layer has alternating P-typed and N-typed doped areas and the doped areas have balanced valance. According to the study, the specific on-resistance (Ron, sp) of the super-junction device is 5-100 times lower than that of the conventional high voltage MOSFET.

Although such super-junction device has both features of high breakdown voltage and low specific on-resistance, the manufacturing process thereof is not easy. To optimize the function of the super-junction device, the alternating P-typed and N-typed doped areas of the composite buffer layer have to be doped with equivalent materials, respectively, to achieve the optimal balanced valence state, but such process is not easy to handle in practice. On the other hand, the practical maximum electrical field of the composite buffer layer has to be limited to about $2*10^5$ V/cm, and the practical maximum electrical field of the super-junction device will confine the breakdown voltage thereof.

Therefore, the ion concentration in the doped area of the high voltage super-junction device has to be precisely controlled. However, in the practical manufacturing process, the doped ion concentration of the high resistance epi wafer used in the high voltage super-junction device is low, and the epi wafer with low ion concentration is easy to be interfered by other external counter ions, so that the breakdown voltage of the device may be reduced and the drain leakage current may be increased.

Please refer to FIG. 1, which is a schematic diagram showing an oxidation mask structure for manufacturing a deep trench of a super-junction device according to the prior art. As shown in FIG. 1, an oxidation mask layer 13, which is used as a mask in the etching process for forming the deep trench structure, is formed on an N-typed epitaxial layer 12 on an N+ substrate 11, wherein the oxidation mask layer 13 is formed by PE-TEOS or LP-TEOS. Since the PE-TEOS or LP-TEOS oxidation mask layer 13 is in contact with the N-typed epitaxial layer, if the oxidation mask layer 13 contains the easily diffusible ions, such as boron or aluminum ions, or the external environment contains the easily diffusible ions 14, these ions will diffuse to the N-typed epitaxial layer 12 during the subsequent high temperature process, which may cause unexpected variation of the doping concentration, resulting that the concentrations of the source, body, and drain of the MOS device are changed, and the breakdown voltage is reduced.

Therefore, by reason that in the manufacturing process of the deep trenched super-junction device, the compositions of the conventional oxidation mask layer 13 may cause the internal or the external ions to diffuse to the surface of the high resistance epitaxial layer and have the electrical property changed, it is necessary to provide an improved mask structure for the super-junction device to overcome the defects of the prior art.

SUMMARY OF THE INVENTION

An object of the present invention is to provide a hard mask structure for manufacturing a deep trench of a super-junction device. The hard mask structure comprises an ion barrier layer including a thermal oxide layer and a nitride layer as a base layer to prevent the easily diffusible ions from diffusing to the surface of the epitaxial layer during the high temperature process, and further prevent the electrical property from being changed.

According to an aspect of the present invention, a hard mask structure is disclosed. The hard mask structure is used for manufacturing a deep trench of a super-junction device having a substrate and an epitaxial layer formed on the substrate. The hard mask structure comprises an ion barrier layer formed on the epitaxial layer for blocking ions from diffusing into the epitaxial layer, and a deposition layer formed on the ion barrier layer. Thereby, the deep trench of the super-junction device is formed by performing an etch process on the epitaxial layer via the hard mask structure.

In an embodiment, the ion barrier layer is a thermal oxide layer, and a thickness ratio of the thermal oxide layer and the deposition layer is substantially 1:1.

In an embodiment, the ion barrier layer comprises a thermal oxide layer in contact with the epitaxial layer, and a nitride layer formed on the thermal oxide layer and in contact with the deposition layer.

In an embodiment, the deposition layer is a PE-TEOS or LP-TEOS deposition layer.

In an embodiment, the etch process is an anisotropic etch process or a dry etch process.

According to another aspect of the present invention, a method for manufacturing a deep trench of a super-junction device is disclosed. The method comprises steps of: (a) providing a substrate and forming an epitaxial layer on said substrate; (b) forming an ion barrier layer on said epitaxial layer; (c) forming a deposition layer on said ion barrier layer; (d) removing parts of said ion barrier layer and said deposition layer to expose said epitaxial layer; (e) performing an etch process on said epitaxial layer using said ion barrier layer and said deposition layer as a mask to form said deep trench; and (f) removing said ion barrier layer and said deposition layer.

The above objects and advantages of the present invention will become more readily apparent to those ordinarily skilled in the art after reviewing the following detailed description and accompanying drawings, in which:

BRIEF DESCRIPTION OF THE DRAWINGS

FIGS. 5(a)-(g) are schematic diagrams showing the method for manufacturing a deep trench of a super-junction device according to another preferred embodiment of the present invention; and.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
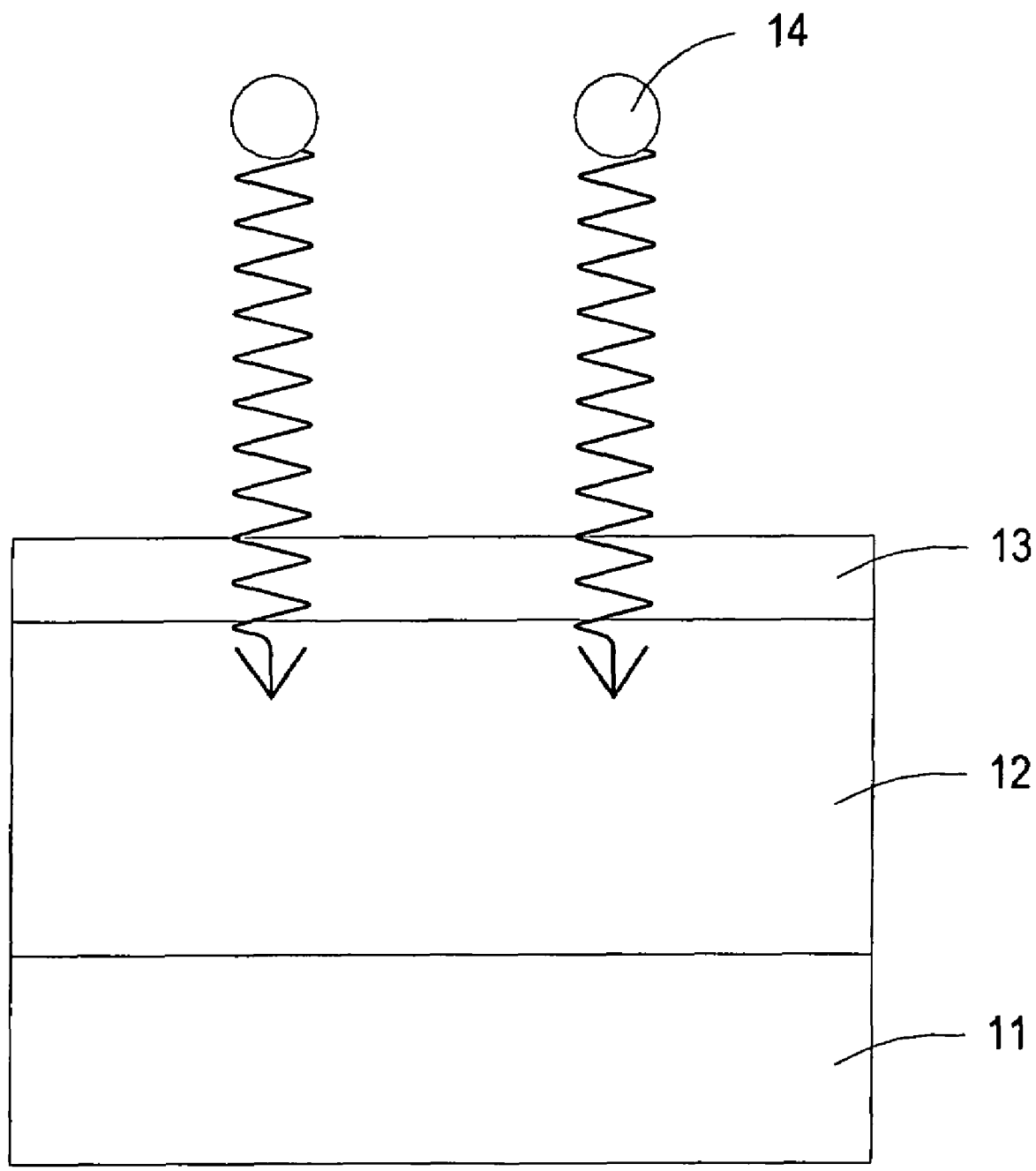
FIG. 1 is a schematic diagram showing an oxidation mask structure for manufacturing a deep trench of a super-junction device according to the prior art.
Figure 2:
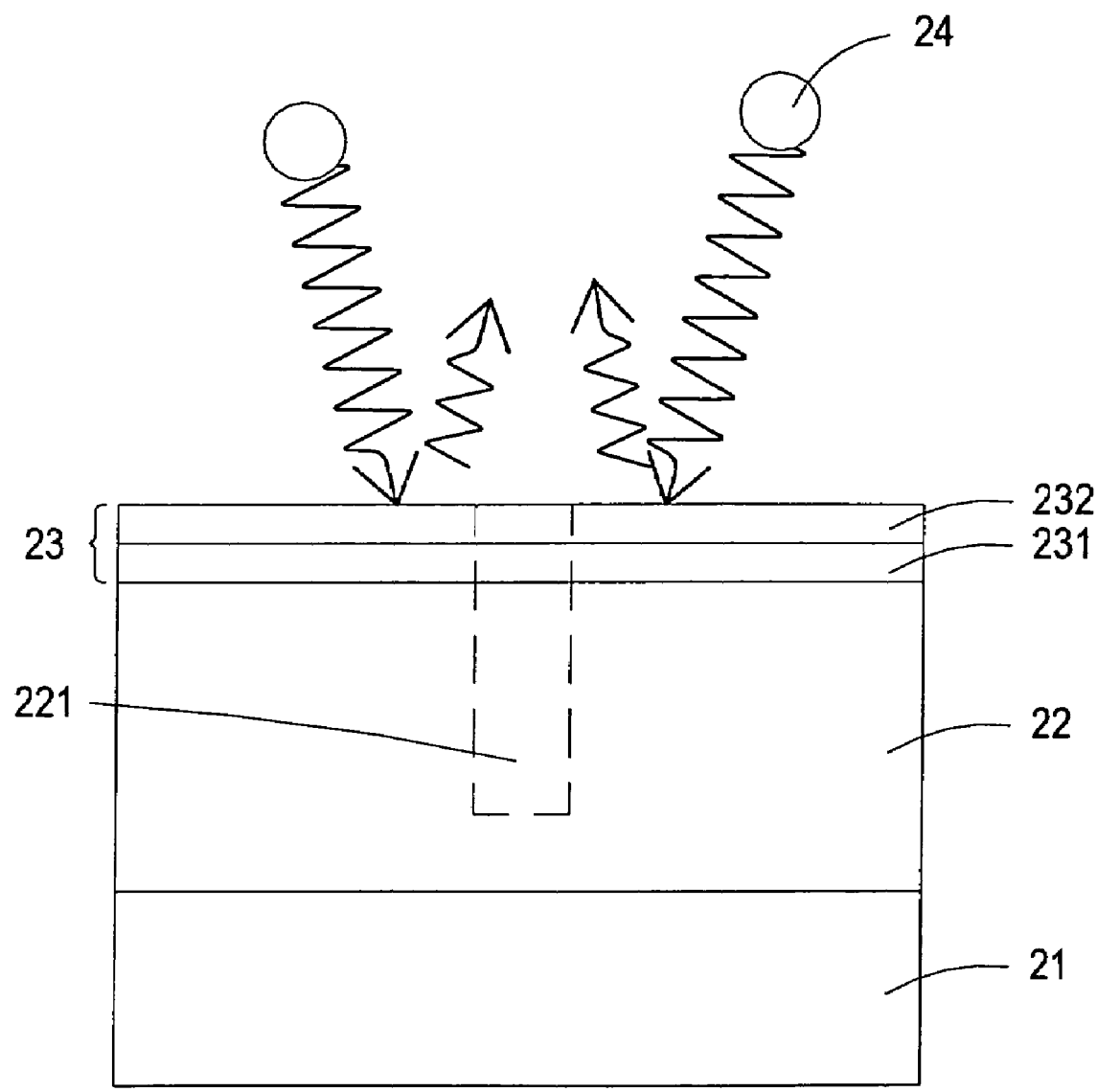
FIG. 2 is a schematic diagram showing the hard mask structure for manufacturing a deep trench of a super-junction device according to a preferred embodiment of the present invention.

Please refer to FIG. 2, which is a schematic diagram showing the hard mask structure for manufacturing a deep trench of a super-junction device according to a preferred embodiment of the present invention. As shown in FIG. 2, the manufacturing process of the deep trench of the super-junction device comprises steps of providing a substrate 21, forming an epitaxial layer 22 on the substrate 21, and forming a hard mask structure 23 on the epitaxial layer 22. The hard mask structure 23 comprises a thermal oxide layer 231 and a deposition layer 232. The thermal oxide layer 231 is formed on the epitaxial layer 22, which is used to form the deep trench, for blocking the ions 24 from diffusing into the epitaxial layer 22. The deposition layer 232 is formed on the thermal oxide layer 231 to form the hard mask structure 23 with the thermal oxide layer 231, so that a deep trench 221 of a super junction device can be formed by performing an etch process on the epitaxial layer via the hard mask structure 23.

In practical application, the thickness ratio of the thermal oxide layer 231 and the deposition layer 232 is substantially 1:1, and the preferred thickness of both layers is 6000 Å. The thermal oxide layer 231 is formed by thermal oxidation, and the deposition layer 232 can be a PE-TEOS or LP-TEOS oxide layer. Via the hard mask structure 23, the epitaxial layer 22 is performed with an anisotropic etch process or a dry etch process to form the deep trench 221 of the super-junction device with a depth of about 40 μm.

Figure 3:
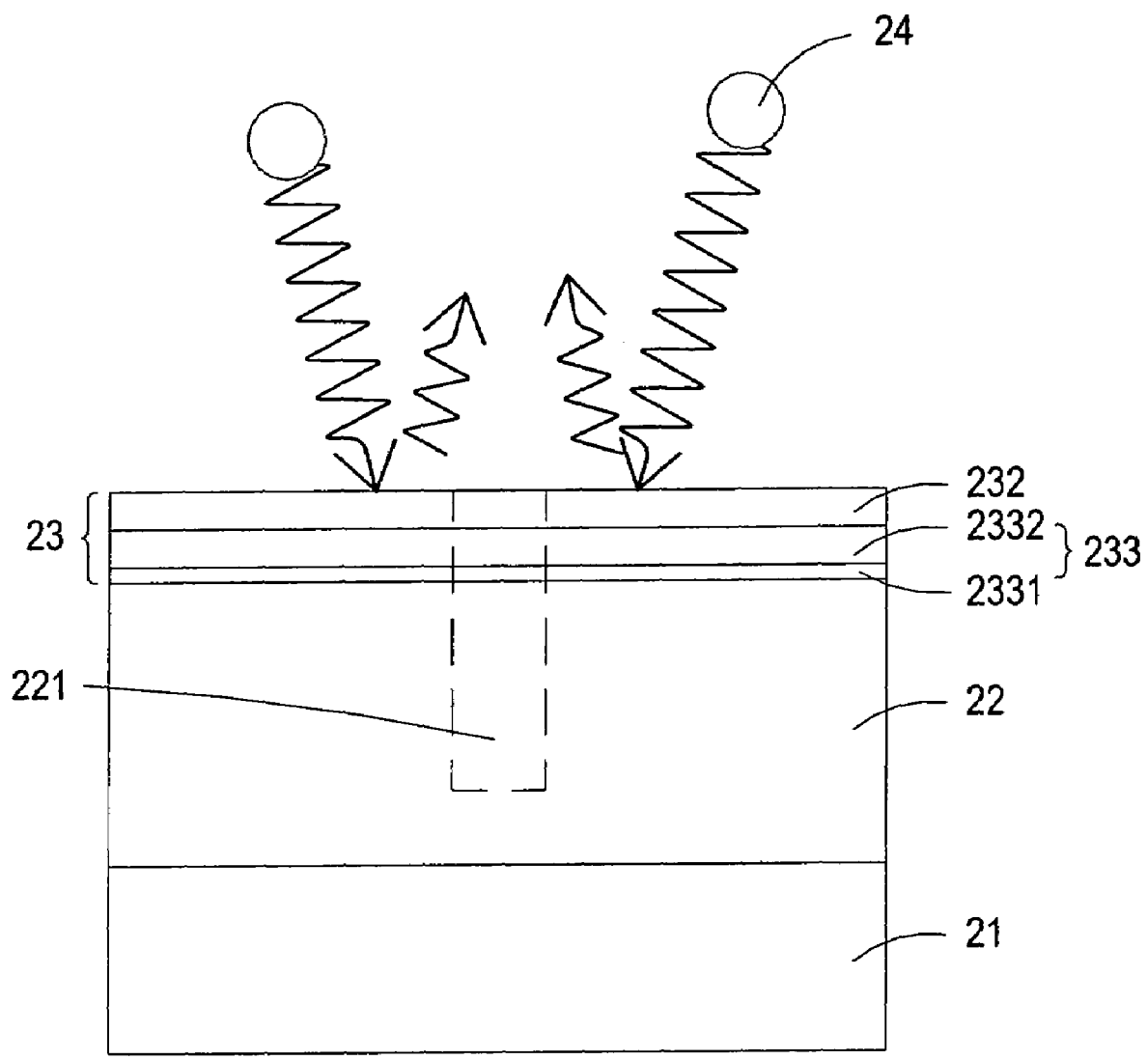
FIG. 3 is a schematic diagram showing the hard mask structure for manufacturing a deep trench of a super-junction device according to another preferred embodiment of the present invention.

Please refer to FIG. 3, which is a schematic diagram showing the hard mask structure for manufacturing a deep trench of a super-junction device according to another preferred embodiment of the present invention. As shown in FIG. 3, the hard mask structure 23 comprises an ion barrier layer 233 and a deposition layer 232. The ion barrier layer 233 is formed on the epitaxial layer 22, which is used to form the deep trench, for blocking the ions 24 from diffusing into the epitaxial layer 22. The deposition layer 232 is formed on the ion barrier layer 233 to form the hard mask structure 23 with the ion barrier layer 233, so that a deep trench 221 of a super junction device can be formed by performing an etch process on the epitaxial layer via the hard mask structure 23. Different from the aforesaid embodiment described in the preceding paragraphs, the ion barrier layer 233 in this embodiment is not merely a thermal oxide layer; it comprises a thermal oxide layer 2331 with a thickness of about 300 Å and a nitride layer 2332 with a thickness of about 2000 Å. The thermal oxide layer 2331 is in contact with the surface of the epitaxial layer 22, and the nitride layer 2332 is formed on the thermal oxide layer 2331 and in contact with the deposition layer 232 with a thickness of about 6000 Å. Via the hard mask structure 23, the epitaxial layer 22 is performed with an anisotropic etch process to form the deep trench 221 of the super-junction device.

As described above, the hard mask structure for manufacturing the deep trench of the super-junction device according to the present invention can be formed with the following embodiments:

(1) 6000 Å thermal oxide layer 231+6000 Å LP-TEOS deposition layer 232;

(2) 6000 Å thermal oxide layer 231+6000 Å PE-TEOS deposition layer 232; or (3) 300 Å thermal oxide layer 2331+2000 Å nitride layer 2332+6000 Å PE-TEOS deposition layer 232.

Through the introduction of the hard mask structure 23, the impurities cannot diffuse into the epitaxial layer 22, so as to prevent unexpected variation of the ion concentration, and obtain the required deep trench 221 of the super-junction device.

Figure 4A:
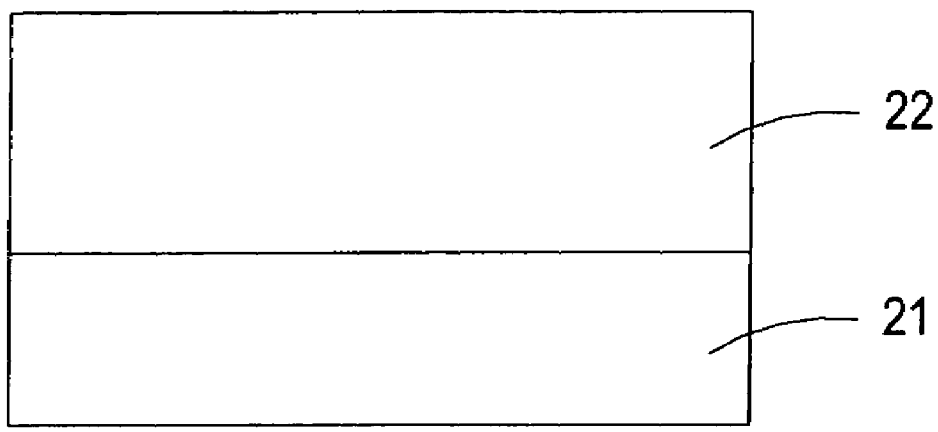
FIGS. 4(a)-(f) are schematic diagrams showing the method for manufacturing a deep trench of a super-junction device according to a preferred embodiment of the present invention.
Figure 4B:
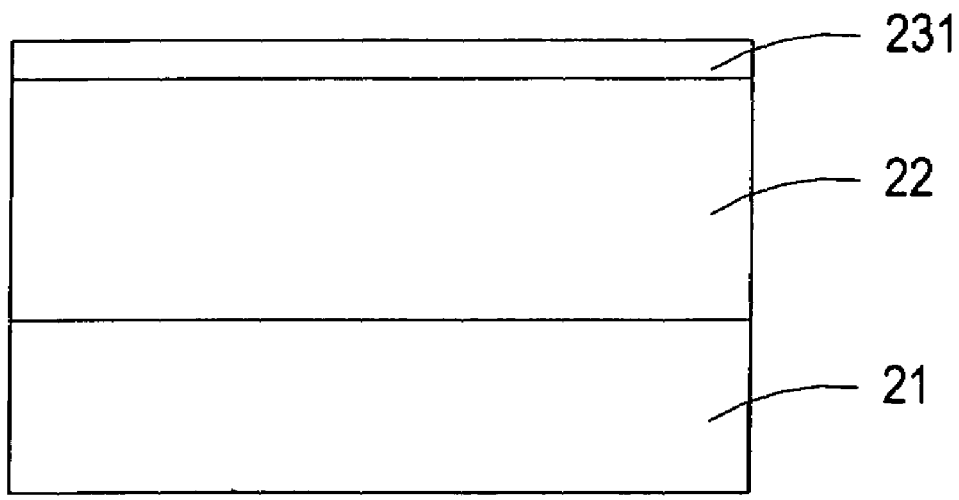
Figure 4C:
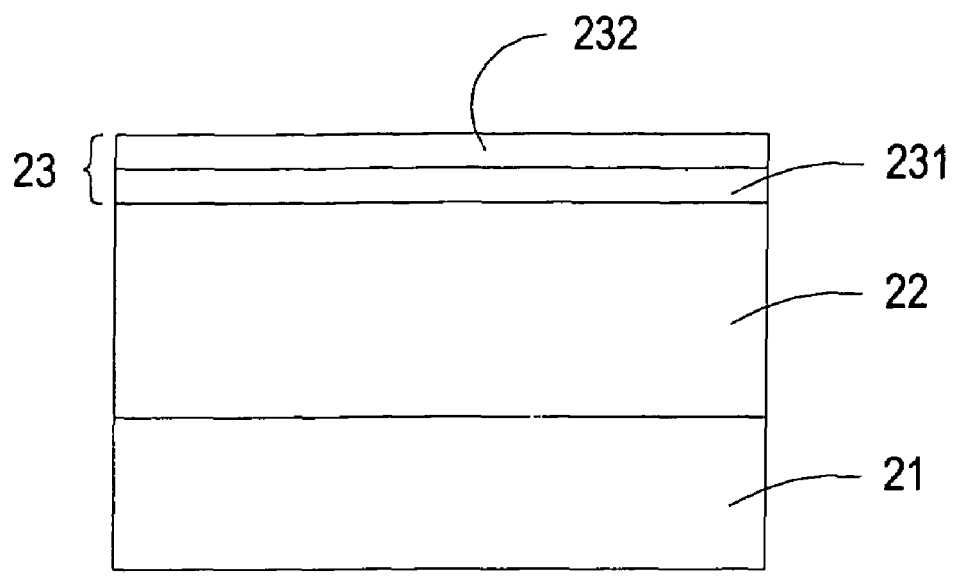
Figure 4D:
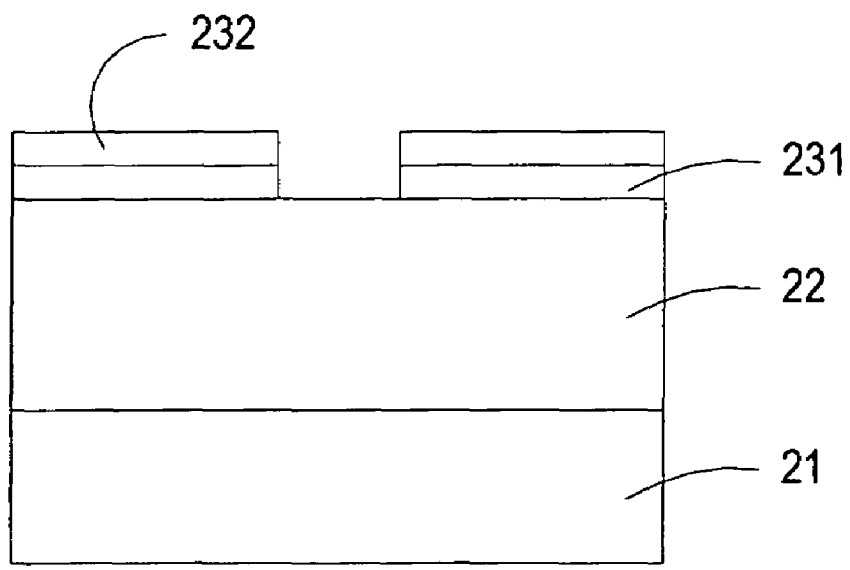
Figure 4E:
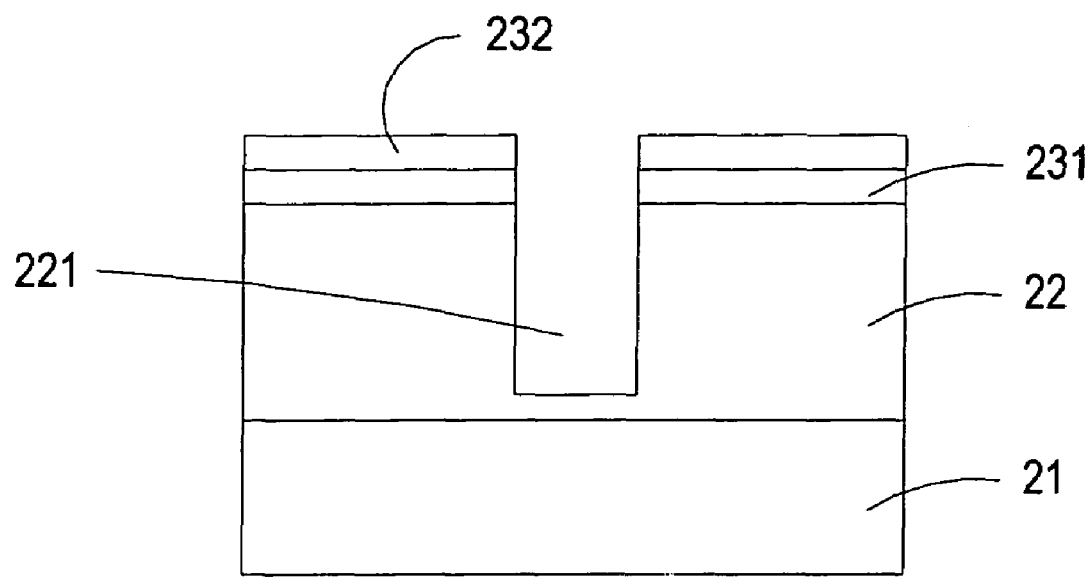
Figure 4F:
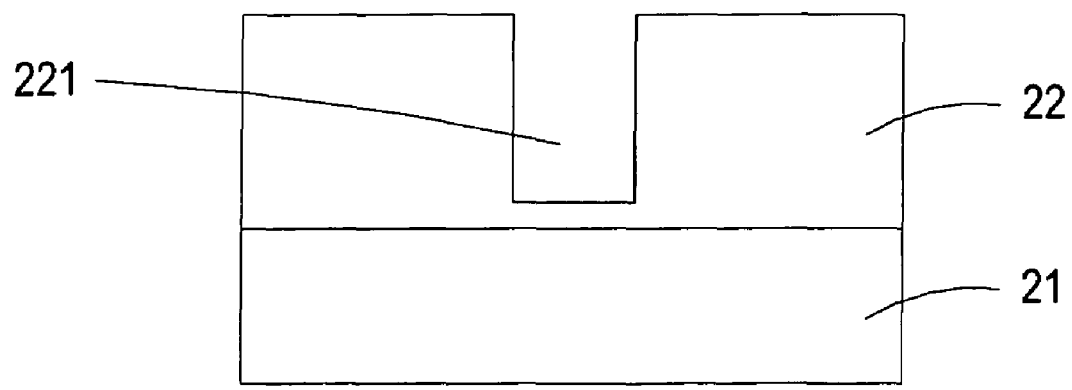

According to the above hard mask structure 23, the present invention also provides the method for manufacturing a deep trench of a super-junction device. Please refer to FIGS. 4(a)-(f), which are schematic diagrams showing the method for manufacturing a deep trench of a super-junction device according to a preferred embodiment of the present invention. As shown in FIG. 4(a), a substrate 21 is provided first, and an epitaxial layer 22 is formed on the substrate 21. Then, a thermal oxide layer 231 is formed on the epitaxial layer 22, as shown in FIG. 4(b), and a deposition layer 232 is formed on the thermal oxide layer 231, as shown in FIG. 4(c). Subsequently, parts of the thermal oxide layer 231 and the deposition layer 232 are removed to expose the epitaxial layer 22, as shown in FIG. 4(d). Using the thermal oxide layer 231 and the deposition layer 232 as a mask, the exposed epitaxial layer 22 is etched to form a deep trench 221, as shown in FIG. 4(e). Finally, the thermal oxide layer 231 and the deposition layer 232 are removed to obtain the deep trench 221 of the super-junction device, as shown in FIG. 4(f). In some embodiments, the step of removing the thermal oxide layer 231 and the deposition layer 232 can be performed by an anisotropic etch process.

Figure 5A:
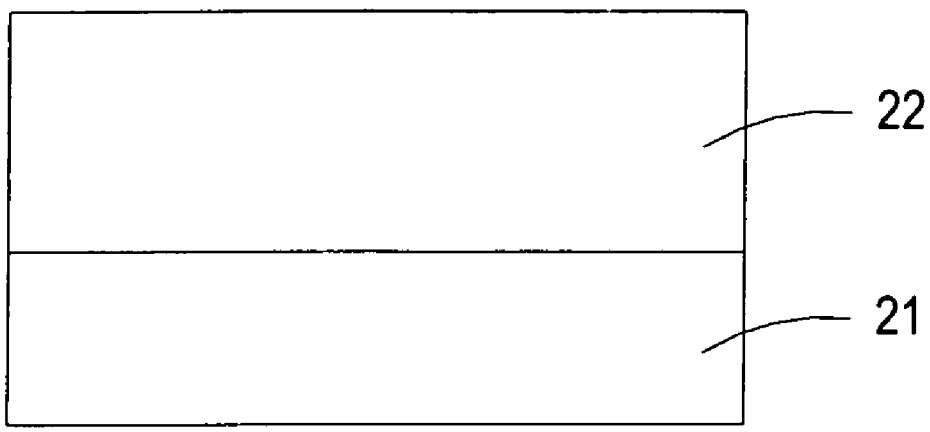
Figure 5B:
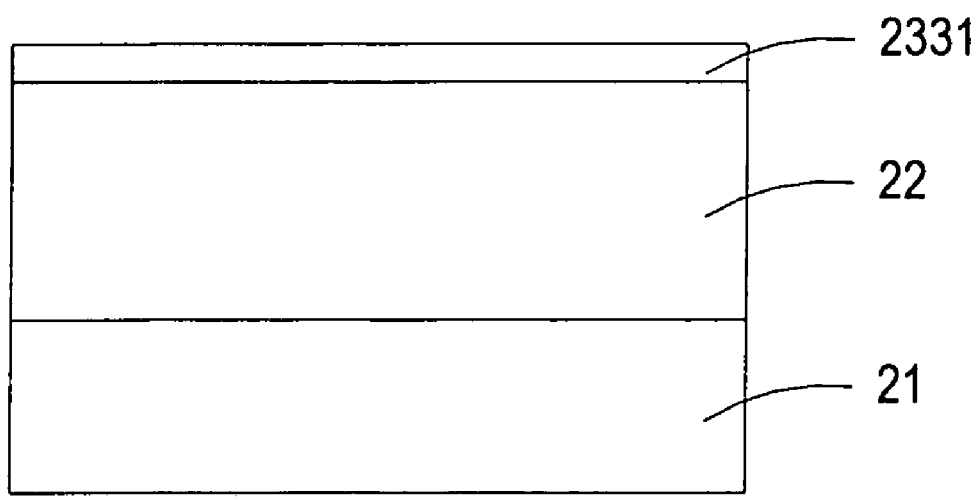
Figure 5C:
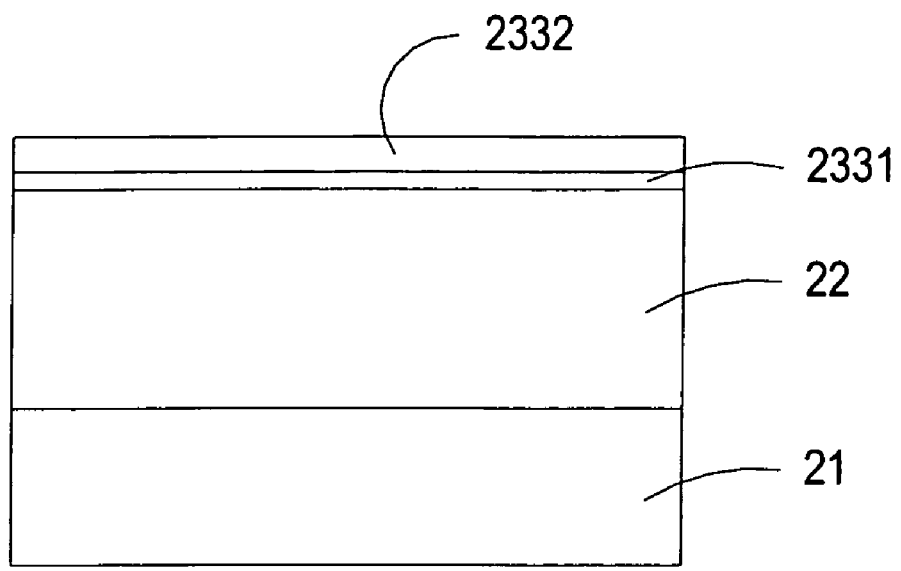
Figure 5D:
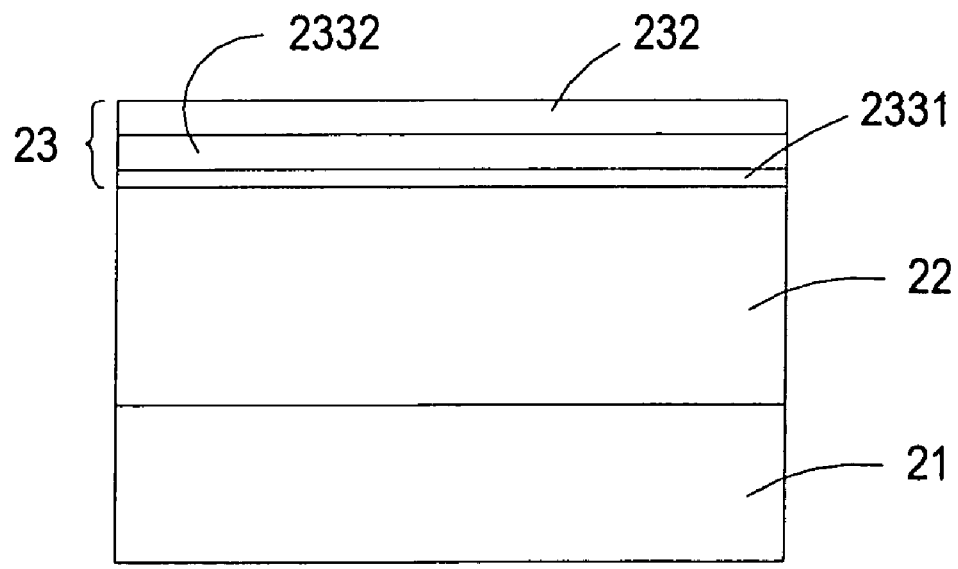
Figure 5E:
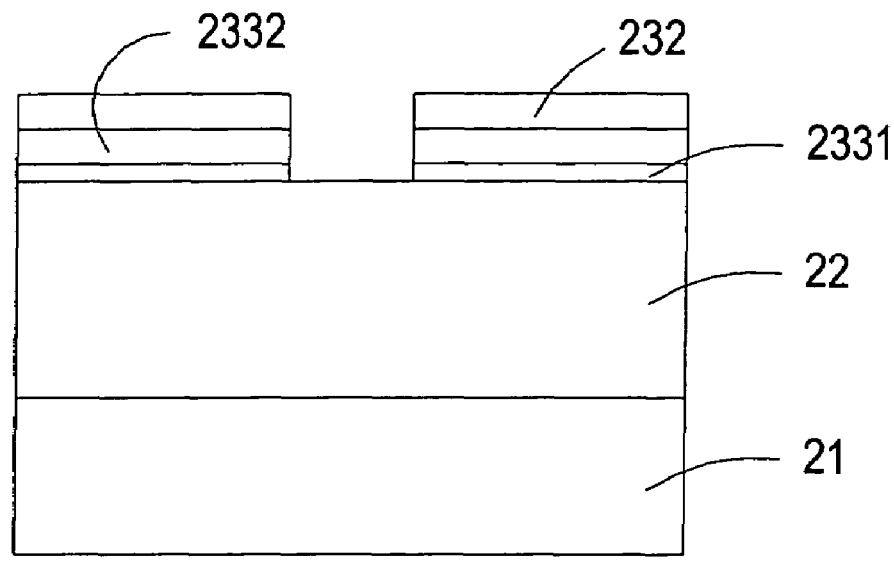
Figure 5F:
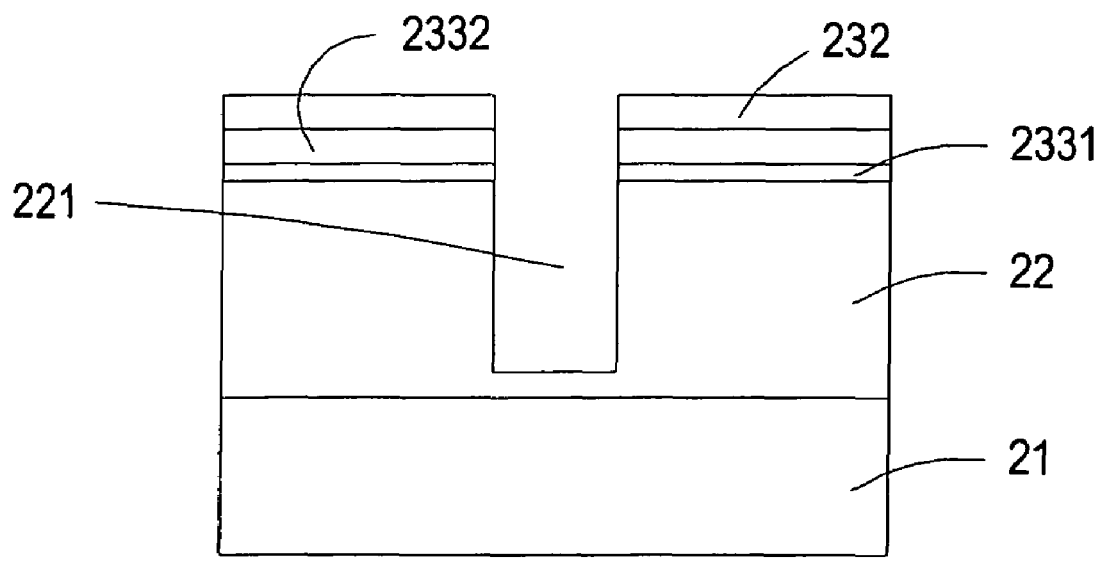
Figure 5G:
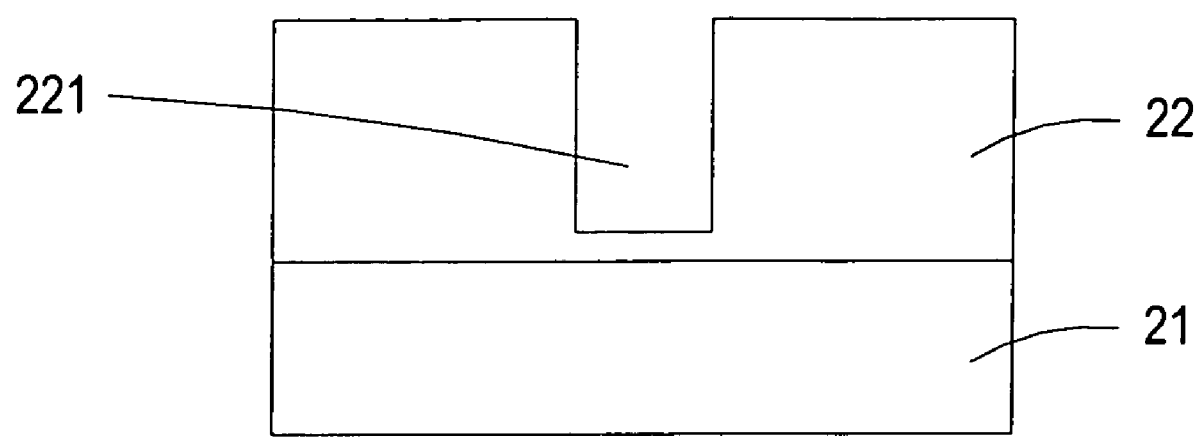

Please refer to FIGS. 5(a)-(g), which are schematic diagrams showing the method for manufacturing a deep trench of a super-junction device according to another preferred embodiment of the present invention. As shown in FIG. 5(a), a substrate 21 is provided first, and an epitaxial layer 22 is formed on the substrate 21. Then, a thermal oxide layer 2331 with a demonstrative thickness of 300 Å is formed on the epitaxial layer 22, as shown in FIG. 5(b), and a nitride layer 2332 with a demonstrative thickness of 2000 Å is formed on the thermal oxide layer 2331, as shown in FIG. 5(c). Subsequently, a deposition layer 232 with a demonstrative thickness of 6000 Å is formed on the nitride layer 2332, as shown in FIG. 5(d). After that, parts of the thermal oxide layer 2331, the nitride layer 2332 and the deposition layer 232 are removed to expose the epitaxial layer 22, as shown in FIG. 5(e). Using the thermal oxide layer 2331, the nitride layer 2332 and the deposition layer 232 as a mask, the exposed epitaxial layer 22 is etched to form a deep trench 221, as shown in FIG. 5(f). Finally, the thermal oxide layer 2331, the nitride layer 2332 and the deposition layer 232 are removed to obtain the deep trench 221 of the super-junction device, as shown in FIG. 5(g). Similarly, the step of removing the thermal oxide layer 2331, the nitride layer 2332 and the deposition layer 232 can be performed by an anisotropic etch process.

Figure 6A:
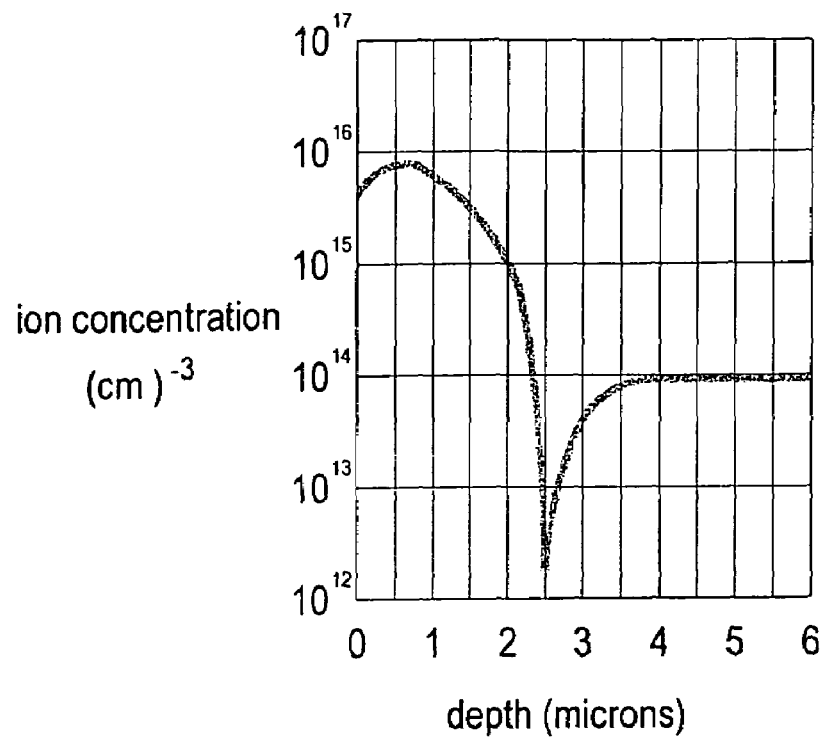
FIGS. 6(a) and (b) are schematic diagrams showing the ion concentration variation at the surface of the epitaxial layer when manufacturing the deep trenched super-junction device by means of the conventional mask and the present hard mask, respectively.
Figure 6B:
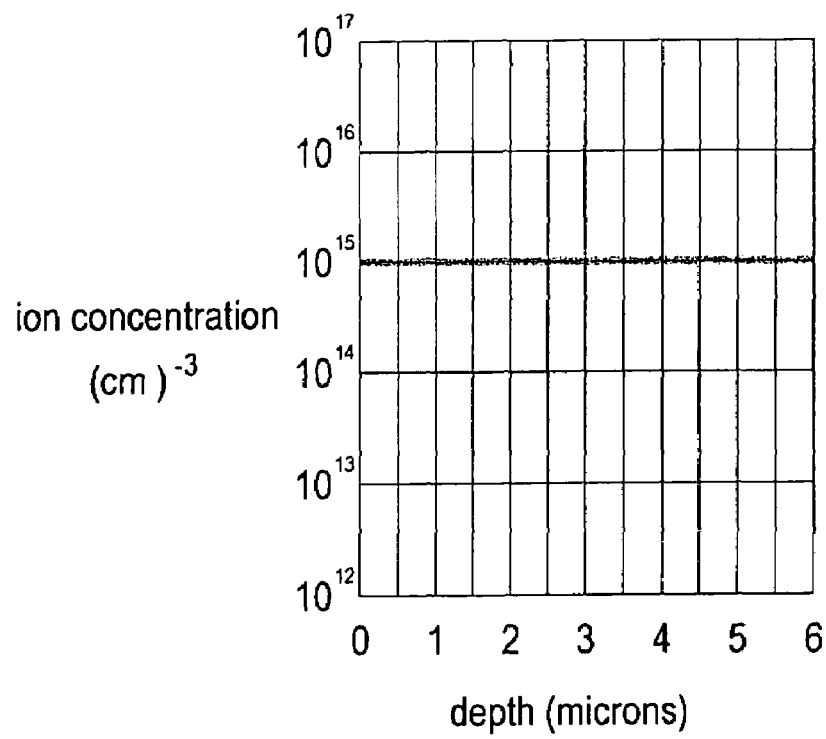

Please refer to FIGS. 6(a) and (b), which are schematic diagrams showing the ion concentration variation at the surface of the epitaxial layer when manufacturing the deep trenched super-junction device by means of the conventional mask and the present hard mask, respectively. The conventional PE-TEOS mask is deposited on the epitaxial layer, and has a total thickness of 1.8 μm, including triple deposited PE-TEOS layers, each with a thickness of 6000 Å. As shown in FIG. 6(a), using the surface plasma resonance (SPR) technique to analyze the ion concentration distribution at the surface of the epitaxial layer after the manufacturing process is completed, it is found some boron or aluminum ions, which may come from the PE-TEOS itself or from external boron or aluminum ions passing through the PE-TEOS and diffusing to the surface of the epitaxial layer during the high temperature process. However, as shown in FIG. 6(b), analyzed by the same SPR technique, no abnormal external ion is found at the surface of the epitaxial layer when using the present hard mask to manufacture the deep trenched super-junction device, no matter which embodiment of the hard mask is employed. For example, the hard mask can be (1) 6000 Å thermal oxide layer 231+6000 Å LP-TEOS deposition layer 232; (2) 6000 Å thermal oxide layer 231+6000 Å PE-TEOS deposition layer 232; or (3) 300 Å thermal oxide layer 2331+ 2000 Å nitride layer 2332+6000 Å PE-TEOS deposition layer 232. Through an electrical property measurement, it is found that the breakdown voltage of the deep trenched super-junction device manufactured by means of the present hard mask is increased to 600 V, while the breakdown voltage is 150 V in the prior art which uses the conventional PE-TEOS mask.

In conclusion, the present invention provides a hard mask structure for manufacturing the deep trench of the super-junction device. Through the introduction of the hard mask structure, the interference in the manufacturing process from the diffused ions can be effectively prevented, so as to avoid unusual electrical property.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a deep trench of a super-junction device, comprising steps of:
   (a) providing a substrate and forming an epitaxial layer on said substrate;
   (b) forming an ion barrier layer on said epitaxial layer for blocking ions from diffusing into said epitaxial layer;
   (c) forming a deposition layer on said ion barrier layer;
   (d) removing parts of said ion barrier layer and said deposition layer to expose said epitaxial layer;
   (e) performing an etch process on said epitaxial layer using said ion barrier layer and said deposition layer as a mask to form said deep trench; and
   (f) removing the entire of said ion barrier layer and the entire of said deposition layer.

2. The method for manufacturing a deep trench of a super-junction device according to claim 1 wherein said ion barrier layer is a thermal oxide layer.

3. The method for manufacturing a deep trench of a super-junction device structure according to claim 2 wherein a thickness ratio of said thermal oxide layer and said deposition layer is substantially 1:1.

4. The method for manufacturing a deep trench of a super-junction device according to claim 1 wherein said ion barrier layer comprises:
   a thermal oxide layer in contact with said epitaxial layer; and
   a nitride layer formed on said thermal oxide layer and in contact with said deposition layer.

5. The method for manufacturing a deep trench of a super-junction device according to claim 1 wherein said deposition layer is a PE-TEOS or LP-TEOS deposition layer.

6. The method for manufacturing a deep trench of a super-junction device according to claim 1 wherein said etch process in step (e) is an anisotropic etch process.

* * * * *